(12) United States Patent
Kim

(10) Patent No.: US 9,129,916 B2
(45) Date of Patent: Sep. 8, 2015

(54) DISPLAY DEVICE INCLUDING TOUCH SENSOR

(71) Applicant: Samsung Display Co., Ltd., Yongin, Gyeonggi-Do (KR)

(72) Inventor: Yun Jae Kim, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/281,672

(22) Filed: May 19, 2014

(65) Prior Publication Data

US 2015/0162388 A1  Jun. 11, 2015

(30) Foreign Application Priority Data

Dec. 11, 2013  (KR) .......................... 10-2013-0153834

(51) Int. Cl.
*H01L 29/08* (2006.01)
*H01L 27/32* (2006.01)

(52) U.S. Cl.
CPC .................................... *H01L 27/323* (2013.01)

(58) Field of Classification Search
None
See application file for complete search history.

(56) References Cited

U.S. PATENT DOCUMENTS

| 7,660,126 B2 | 2/2010 | Cho et al. |
| 7,750,899 B2 | 7/2010 | Miyata et al. |
| 2013/0148051 A1 | 6/2013 | Kim |

FOREIGN PATENT DOCUMENTS

| JP | 6-132057 A | 5/1994 |
| JP | 3213736 B2 | 7/2001 |
| KR | 10-2005-0064861 A | 6/2005 |
| KR | 10-2011-0045721 A | 5/2011 |

*Primary Examiner* — Reema Patel
(74) *Attorney, Agent, or Firm* — Knobbe, Martens, Olson & Bear, LLP

(57) ABSTRACT

A display device including a touch sensor is disclosed. In one aspect, the display device includes a lower substrate and a display layer formed over the lower substrate. An upper substrate is formed over the display layer and a touch sensing layer is formed over the upper substrate. The display device also includes a first flexible printed circuit board electrically connected to the display layer and attached to a surface of the lower substrate and a second flexible printed circuit board electrically connected to the touch sensing layer and attached to the surface of the lower substrate. The second flexible printed circuit board includes a body having a first end connected to the touch sensing layer and a tail extending from a second end. The tail includes a connection portion electrically connected to the first flexible printed circuit board and at least a portion of the tail is bent.

19 Claims, 10 Drawing Sheets

DISPLAY DEVICE INCLUDING TOUCH SENSOR

CROSS-REFERENCE TO RELATED APPLICATIONS

This application claims priority to and the benefit of Korean Patent Application No. 10-2013-0153834 filed on Dec. 11, 2013, the entire contents of which are incorporated herein by reference.

BACKGROUND

1. Field

The described technology generally relates to a display device.

2. Description of the Related Technology

Flat panel displays (FPDs), such as organic light-emitting diode (OLED) displays, liquid crystal displays (LCDs), and electrophoretic displays (EPDs), include a pair of field generating electrodes and an electro-optical active layer interposed therebetween. OLED displays include an organic emission layer as the electro-optical active layer, LCDs include a liquid crystal layer as the electro-optical active layer, and EPDs includes particles having a charge as the electro-optical active layer. The field generating electrodes receive a data signal through a switching element, such as a thin film transistor (TFT), and the electro-optical active layer displays an image by converting the data signal into an optical signal.

Flat panel displays can also include a touch sensor to receive input from a user. The touch sensor senses changes in pressure, stored charge, light, or the like, which are applied to a screen when a user touches the screen with his/her finger, a touch pen, or the like. Touch information indicating whether an object has touched the screen, the touched position, and the like are generated based on the sensed characteristic. The display device receives different image signals based on the touch information.

The above information disclosed in this Background section is only intended to facilitate the understanding of the background of the described technology and therefore it may contain information that does not constitute the prior art that is already known in this country to a person of ordinary skill in the art.

SUMMARY OF CERTAIN INVENTIVE ASPECTS

One inventive aspect is a display device including a touch sensor and having a reduced dead space.

Another aspect is a display device including a touch sensor and having an area occupied by a flexible printed circuit board for the touch sensor.

Another aspect is a display device, including a lower substrate and an upper substrate, a display layer which is formed on the lower substrate and includes an electro-optical active layer, a touch sensing layer which is formed on the upper substrate, a first flexible printed circuit board which is connected to the display layer and attached to a rear surface of the lower substrate, and a second flexible printed circuit board which is connected to the touch sensing layer and attached to the rear surface of the lower substrate. The second flexible printed circuit board may include a body part of which one end is connected to the touch sensing layer and a tail part which extends from the other end of the body part, and an edge of the tail part may be connected to the first flexible printed circuit board and at least a portion of the tail part may be bent.

At least a portion of the tail part may be bent so as to have a length shorter than an unbent state.

The bent shape may be approximately a U-letter shape.

A portion of the tail part may be bent in a U-letter shape and the bent portion may be more flexible than the other portions of the tail part. The bent portion may have a thickness less than the other portions of the tail part.

The edge of the tail part may be connected to the first flexible printed circuit board through a zero insertion force (ZIF) connector. The edge of the tail part may be connected to the first flexible printed circuit board through an anisotropic conductive film (ACF) bonding.

A cushion layer may be formed between the lower substrate and the first and second flexible printed circuit boards and the first and second flexible printed circuit boards may be attached to the cushion layer.

The first and second flexible printed circuit boards may be bent surrounding a portion of one edge of the lower substrate and the bent portion of the second flexible printed circuit board may protrude less from the edge than that of the first flexible printed circuit board.

The first and second flexible printed circuit boards may not overlap each other around the edge.

The body part of the second flexible printed circuit board may not overlap the first flexible printed circuit board and at least a portion of the tail part of the second flexible printed circuit board may overlap the second flexible printed circuit board.

At one edge of the lower substrate, a portion surrounded by the second flexible printed circuit board may protrude less than a portion surrounded by the first flexible printed circuit board.

A display driving unit may be formed on the lower substrate and a touch driving unit may be formed on the second flexible printed circuit board.

The electro-optical active layer may be an organic emission layer and the upper substrate may be an encapsulation substrate.

The touch sensing layer may be formed on a surface which does not face the lower substrate among both surfaces of the upper substrate.

Another aspect is a display device including a lower substrate, a display layer formed over the lower substrate and including a plurality of pixels, wherein each pixel includes an electro-optical active layer, an upper substrate formed over the display layer, a touch sensing layer formed over the upper substrate, a first flexible printed circuit board electrically connected to the display layer and attached to a surface of the lower substrate, wherein the first flexible printed circuit board includes a first body, and a second flexible printed circuit board electrically connected to the touch sensing layer and attached to the surface of the lower substrate, wherein the second flexible printed circuit board includes i) a second body having a first end connected to the touch sensing layer and ii) a tail extending from a second end of the second body, wherein the first and second ends oppose each other, wherein the tail includes a connection portion electrically connected to the first flexible printed circuit board, and wherein at least a portion of the tail is bent.

The bent portion of the tail has a substantially U-shape. The bent portion of the tail is more flexible than the remaining portion of the tail. The bent portion of the tail has a thickness that is less than that of the remaining portion of the tail. The connection potion of the tail is connected to the first flexible printed circuit board through a zero insertion force (ZIF) connector. The connection portion of the tail part is connected to the first flexible printed circuit board through an anisotropic conductive film (ACF). The display device further includes a cushion layer interposed between the surface of lower substrate and the first and second flexible printed circuit boards, wherein the first and second flexible printed circuit boards are attached to the cushion layer. The first and second bodies are bent around an edge of the lower substrate and the bent portion of the first body protrudes farther from the edge than that of the second body. The bent portions of first and second bodies do not overlap each other. The second body does not overlap the first flexible printed circuit board and at least a portion of the tail overlaps the first flexible printed circuit board. A recess is formed in a portion of the edge of the lower substrate adjacent to the bent portion of the second body. The display device further includes a recess is formed in a portion of the edge of the lower substrate adjacent to the bent portion of the second body and a touch driver formed under the second flexible printed circuit board and configured to drive the touch sensing layer. The electro-optical active layer is an organic emission layer and the upper substrate is an encapsulation substrate.

Another aspect is a display device including a substrate, a plurality of pixels formed over the substrate, an encapsulation layer formed over the pixels, a touch sensing layer formed over the encapsulation layer, a first flexible printed circuit board including a first connection portion formed over the substrate and electrically connected to the pixels and a first body attached to a surface of the substrate, and a second flexible printed circuit board including a second connection portion formed over and electrically connected to the touch sensing layer and a second body attached to the surface of the substrate, wherein the first flexible circuit board protrudes farther from an edge of the substrate than the second flexible circuit board. The first and second bodies are bent around the edge of the substrate. The second flexible circuit board further includes a tail extending from the second body and electrically connected to the first flexible circuit board. At least a portion of the tail is bent and wherein the bent portion of the tail is more flexible than the remaining portion of the tail. A recess is formed in a portion of the edge of the substrate adjacent to the bent portion of the second body. The first and second bodies do not overlap each other.

According to at least one embodiment, it is possible to minimize the dead space due to the protruding length of the bent part of the flexible printed circuit board (FPCB) for the touch sensor. It is possible to save space in which other structures such as components or a bracket can be formed by reducing the dead space, thereby implementing a more compact and robust structure.

DETAILED DESCRIPTION OF CERTAIN INVENTIVE EMBODIMENTS

Figure 1:
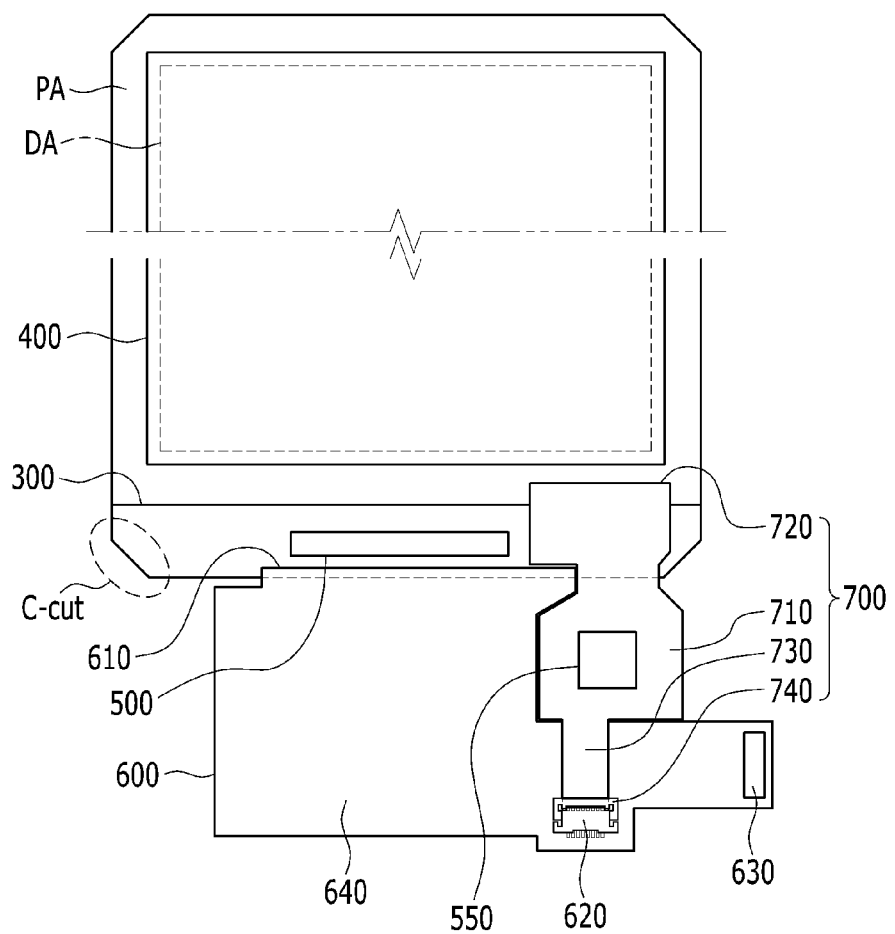
FIG. 1 is a plan view schematically illustrating the structure of a flexible printed circuit board before being bent in a display device according to an exemplary embodiment.

The described technology will be described more fully hereinafter with reference to the accompanying drawings, in which exemplary embodiments are shown.

As those skilled in the art would realize, the described embodiments may be modified in various different ways, all without departing from the spirit or scope of the described technology.

In the drawings, the thicknesses of layers, films, panels, regions, etc., may be exaggerated for clarity Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a display device according to an exemplary embodiment will be described in detail with reference to the accompanying drawings. The exemplary embodiments will be mainly described below with reference to an organic light-emitting diode (OLED) display, but may also be applied to other display devices, such as a liquid crystal display (LCD), an electrophoretic display (EPD), and a plasma display (PDP).

The display device according to an exemplary embodiment will be described with reference to FIGS. 1 to 4.

Figure 2:
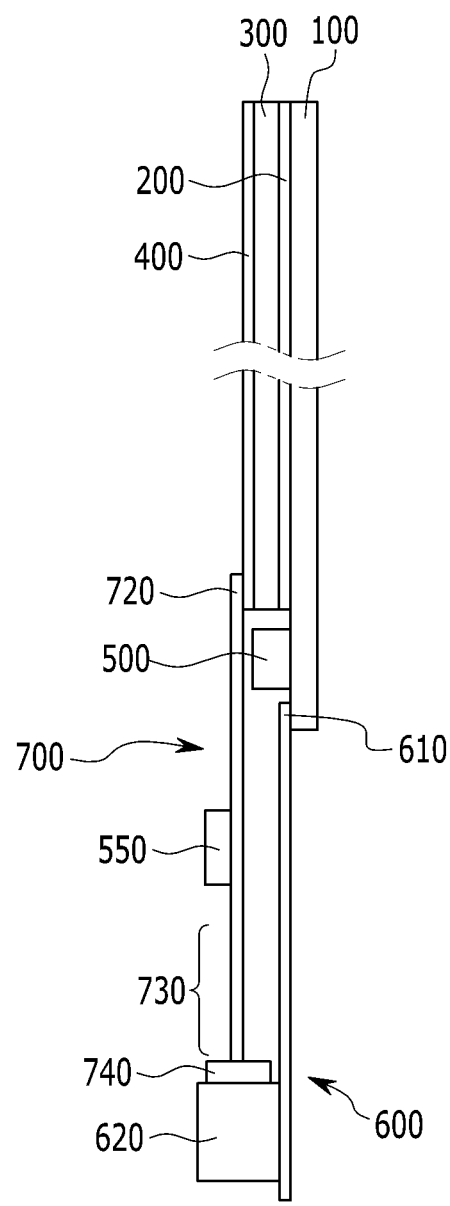
FIG. 2 is a side view of the display device illustrated in FIG. 1.

Referring first to FIGS. 1 and 2, the structure of the display device before a flexible printed circuit board (FPCB) is bent and attached to a rear surface of a lower substrate is illustrated.

The display device includes a lower substrate 100, a display layer 200, an upper substrate 300, and a touch sensing layer 400. The display device includes a first flexible printed circuit board 600 which is electrically connected to the display layer 200 and a second flexible printed circuit board 700 which is electrically connected to the touch sensing layer 400. The display device includes a display driving unit or display driver 500 and a touch driving unit or touch driver 550.

When viewed in a plane view, the display device includes a display area DA in images are displayed and a peripheral area PA surrounding the display area.

A plurality of pixels are formed in the display area DA. Each pixel includes a thin film transistor (TFT) to be described below, a capacitor, and an electro-optical active layer. The display area DA also includes a plurality of display signal lines (not illustrated) which apply driving signals. The display signal lines includes gate lines which apply gate signals and data lines which apply data signals. The display signal lines extend to the peripheral area PA to form a pad part or pad portion (not illustrated) on the lower substrate 100. The display layer 200 includes the pixels and the display signal lines electrically connected to the pixels and the pixels and the display signal lines are formed on the lower substrate 100.

The touch sensing layer 400 is formed a touch active area and is formed on the upper substrate 300. The touch sensing layer 400 includes a plurality of touch electrodes (not illustrated) and a plurality of touch signal lines (not illustrated) which transmit and/or receive signals from the touch electrodes. The touch signal lines extend to form the pad part (not illustrated) on the upper substrate 300.

The display driving unit 500 includes driving devices, such as a data driver which applies data voltages to the data lines, a gate driver which applies gate-on voltages to the gate lines, and a signal controller which controls the operations of the data driver and the gate driver. The display driving unit 500 is formed in the peripheral area PA of a substrate, for example, the lower substrate 100. According to some embodiments, the display driving unit 500 is formed on the first flexible printed circuit board 600 or on a separate printed circuit board (not illustrated).

The touch driving unit 550 applies sensing input signals to the touch sensing layer 400. The touch driving unit 550 also generates touch information indicating whether touch input has occurred, is made, the touched position, and the like, by processing sensing output signals from the touch sensing layer 400. The touch driving unit 550 is formed on the second flexible printed circuit board. Depending on the embodiment, the touch driving unit 550 is formed in the peripheral area PA of a substrate, for example, the upper substrate 300 or on a separate printed circuit board (not illustrated).

Signals for controlling the display driving unit 500 or the display layer 200 are applied through the first flexible printed circuit board 600. The first flexible printed circuit board 600 includes a first connection part or first connection portion 610, a second connection part or second connection portion 620, an input unit 630, and a body part or body 640.

The first connection part 610 is attached to an attachment region (not illustrated) of the lower substrate 100 to electrically connect the first flexible printed circuit board 600 to the display layer 200 formed on the lower substrate 100. Herein, it is to be understood that the connection to the display layer 200 also includes connection through the display driving unit 500 formed on the lower substrate 100. A film such as an anisotropic conductive film (ACF) may be interposed between the first connection part 610 and the attachment region of the lower substrate 100 to facilitate bonding therebetween. The second connection part 620 is electrically connected to the second flexible printed circuit board 700 to be described below. The input unit 630 receives input signals from and external source. The body part 640 includes various circuit elements.

The transfer of the signals to/from the touch sensing layer 400 is performed through the second flexible printed circuit board 700. The second flexible printed circuit board 700 includes a body part or body 710, a first connection part or first connection portion 720, a tail part or tail 730, and a second connection part or second connection portion 740.

The first connection part 720 is attached to an attachment region (not illustrated) of the upper substrate 300 to electrically connect the second flexible printed circuit board 700 to the touch sensing layer 400 formed on the upper substrate 300. A film such as the anisotropic conductive film may be interposed between the first connection part 720 and the attachment region of the upper substrate 300. The body part 710 includes the touch driving unit 550 and signals received from the touch driving unit 550 and from the touch sensing layer 400 are transferred through the first connection part 720.

The tail part 730 extends from an edge of the body part 710 which faces the first connection part 720. The tail part 730 has a substantially rectangular shape and is integrally formed with the body part 710. The tail part 730 is generally flat when no force is applied thereto or a predetermined portion thereof can also be bent in a substantially U-letter shape when no force is applied. In the latter configuration, when a force is applied, the U-letter shape can be unbent to be substantially flat and when the force is subsequently relieved, the U-letter shape is recovered. The predetermined portion of the tail part 730 is formed to be thinner than the remainder of the second flexible printed circuit board 700 and thus is more flexible than the remainder thereof. The tail part 730 has a shorter length when bent than when unbent.

The end of the tail part 730 includes the second connection part 740 which is connected to the second connection part 620 of the first flexible printed circuit board 600. The second flexible printed circuit board 700 receives external signals through the input unit 630 of the first flexible printed circuit board 600 and/or signals generated/processed by the circuit element of the first flexible printed circuit board 600.

The second connection parts 620 and 740 of the first and second flexible printed circuit boards 600 and 700 form a zero insertion force (ZIF) connector. In some embodiments, the second connection part 620 is a ZIF socket and the second connection part 740 is a portion insertable therein. To connect the second flexible printed circuit board 700 to the first flexible printed circuit board 600 through the ZIF connector, the second connection part 740 needs to be inserted into the second connection part 620, and thus, there is a limitation in the overall length of the second flexible printed circuit board 700. According to some embodiments, the second connection parts 620 and 740 are connected to each other by the anisotropic conductive film (ACF) bonding.

The attachment region of the lower substrate 100 for connection of the first flexible printed circuit board 600 and the attachment region of the upper substrate 300 for connection of the second flexible printed circuit board 700 are formed on the same side of the substrates 100 and 300. The upper substrate 300 at the corresponding corner is formed to be shorter than the lower substrate 100 and the exposed lower substrate 100 includes the display driving unit 500 and the attachment region.

Moreover, to reduce the risk of breakage, the corner of the lower substrate 100 is chamfered, which is referred to as a C-cut in the figures. The rear surface of the lower substrate 100 includes a cushion layer (not illustrated) for protecting the lower substrate 100. A window (not illustrated) for protecting the lower substrate 100, the display layer 200, and the upper substrate 300 are positioned on the touch sensing layer 400. When the display device is an OLED display, the upper substrate 300 is encapsulation substrate to prevent moisture and/or oxygen from being permeated from the outside.

Figure 3:
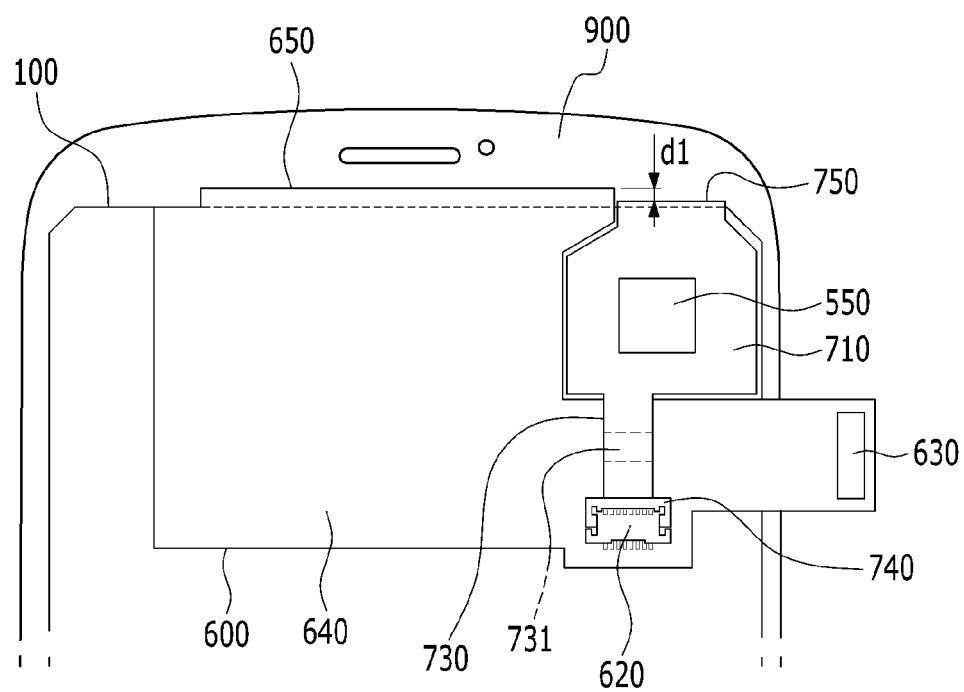
FIG. 3 is a plan view schematically illustrating the structure of the flexible printed circuit board in the display device of FIG. 1 when it is bent and attached to a rear surface of a lower substrate.
Figure 4:
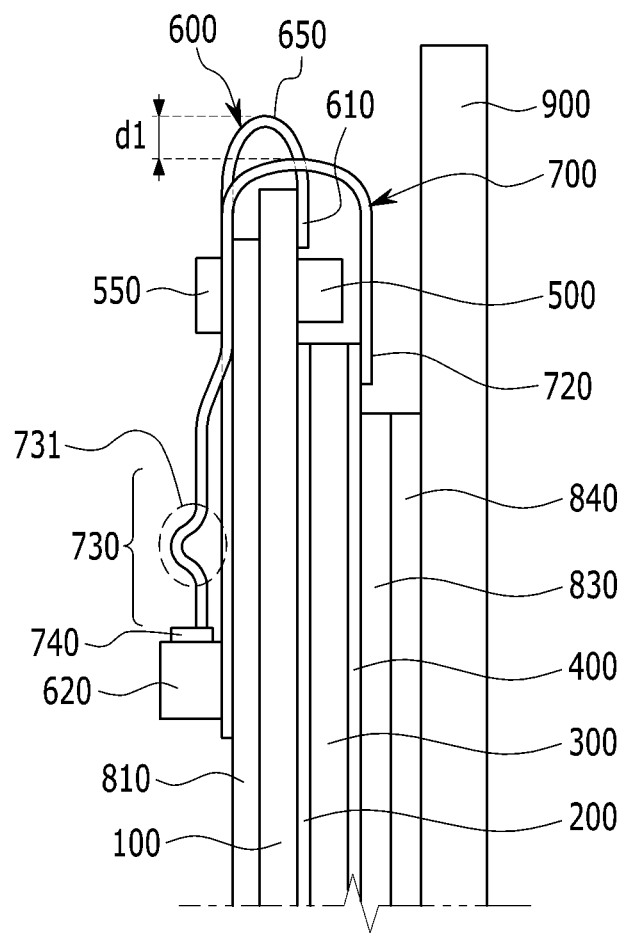
FIG. 4 is a side view of the display device illustrated in FIG. 3.

FIGS. 1 and 2 illustrate the state in which the first and second flexible printed circuit boards 600 and 700 are connected to each other through the connection parts 620 and 740 and are respectively connected to the touch sensing layer 400 and the display layer 300. FIGS. 3 and 4 illustrate the state in which the first and second flexible printed circuit boards 600 and 700 are bent around an edge of the lower substrate 100 and attached to the rear side of lower substrate 100 such that the display device is employed in an actual product. FIGS. 3 and 4 illustrate a polarizing layer 830, a resin layer 840, and a window 900 which are formed on the touch sensing layer 400. The polarizing layer 830 reduces the reflection of external light to increase the contrast ratio. The resin layer 840 is an adhesive layer for attaching the window 900 to the display device.

Referring to FIGS. 3 and 4, a bending part or bendable portion 650 of the first flexible printed circuit board 600 is bent around the edge of the lower substrate 100 to which the first connection part 610 of the first flexible printed circuit board 600 is attached and the body part 640 of the first flexible printed circuit board 600 is attached to the rear surface of the lower substrate 100.

A bending part or bendable portion 750 of the second flexible printed circuit board 700 is bent around the edge of the upper substrate 300 to which the first connection part 720 of the second flexible printed circuit board 700 is attached and the edge of the lower substrate 100 which is not covered by the bending part 650 of the first flexible printed circuit board 600. The body part 710 of the second flexible printed circuit board 700 is also attached to the rear surface of the lower substrate 100. The bending part 750 and the body part 710 of the second flexible printed circuit board 700 do not overlap the first flexible printed circuit board 600 and the tail part 730 thereof overlaps the first flexible printed circuit board 600.

Due to the material characteristics of the flexible printed circuit board, the bending parts 650 and 750 of the first and second flexible printed circuit boards 600 and 700 somewhat protrude from the edge without contacting the edge of the lower substrate 100, which leads to dead space. According to at least one embodiment, the bending part 750 of the second flexible printed circuit board protrudes less than the bending part 650 of the first flexible printed circuit board. The difference between the protrusion distances of the bending part 750 of the second flexible printed circuit board and the bending part 650 is a distance d1. Thus, the dead space is reduced by the distance d1 and the extra space can be used for other components or structures.

To reduce the protrusion of the bending part 750 of the second flexible printed circuit board, the entire length of the second flexible printed circuit board 700 can be reduced. However, when the entire length of the second flexible printed circuit board 700 is reduced, it may be impossible to connect the second flexible printed circuit board to the first flexible printed circuit board 600. At the connection by, for example, the above described ZIF connector, the second connection part 740 of the second flexible printed circuit board may not reach the second connection part 620 of the first flexible printed circuit board to be inserted or may be easily separated from the second connection part 620 of the first flexible printed circuit board even though the second connection part 740 of the second flexible printed circuit board is inserted into the second connection part 620 of the first flexible printed circuit board.

According to the embodiment of FIGS. 3 and 4, the tail part 730 of the second flexible printed circuit board 700 includes a part or portion 731 bent in, for example, a U-letter shape without reducing the length of the second flexible printed circuit board 700. The bent part 731 is not bent at the time of connection between the first and second flexible printed circuit boards to ensure a sufficient insertion depth of the second connection part 740 and enables a reduction in protrusion of the bending part 650 of the second flexible printed circuit board. Due to the bent part 731, the second flexible printed circuit board 700 is attached to a cushion layer 810 through, for example, a double-sided adhesive tape without being separated therefrom.

The part 731 bent in the U-letter shape of the tail part 730 is more flexible than the remainder of the tail part 730 and is thus more easily bent. In some embodiments, the bent part 731 of the tail part 730 is formed as a single layer and the remainder thereof is formed as a multilayer. Herein, the single layer refers to the base layer structure of the flexible printed circuit board formed of a base film, a circuit layer, and a cover film and the multilayer refers to a structure in which the base layer is stacked with at least one additional layer. Therefore, the bent part 731 of the tail part 730 is naturally in an unbent state, but the second flexible printed circuit board is attached to the lower substrate 100 side and the bent part 731 is then bent.

In other embodiments, the bent part 731 of the tail part 730 is naturally bent and then is then unbent to be flat when a small force is applied thereto at the time of the connection to, for example, the first flexible printed circuit board. When the force is removed, the bent part 731 of the tail part 730 returns to a bent shape.

Figure 5:
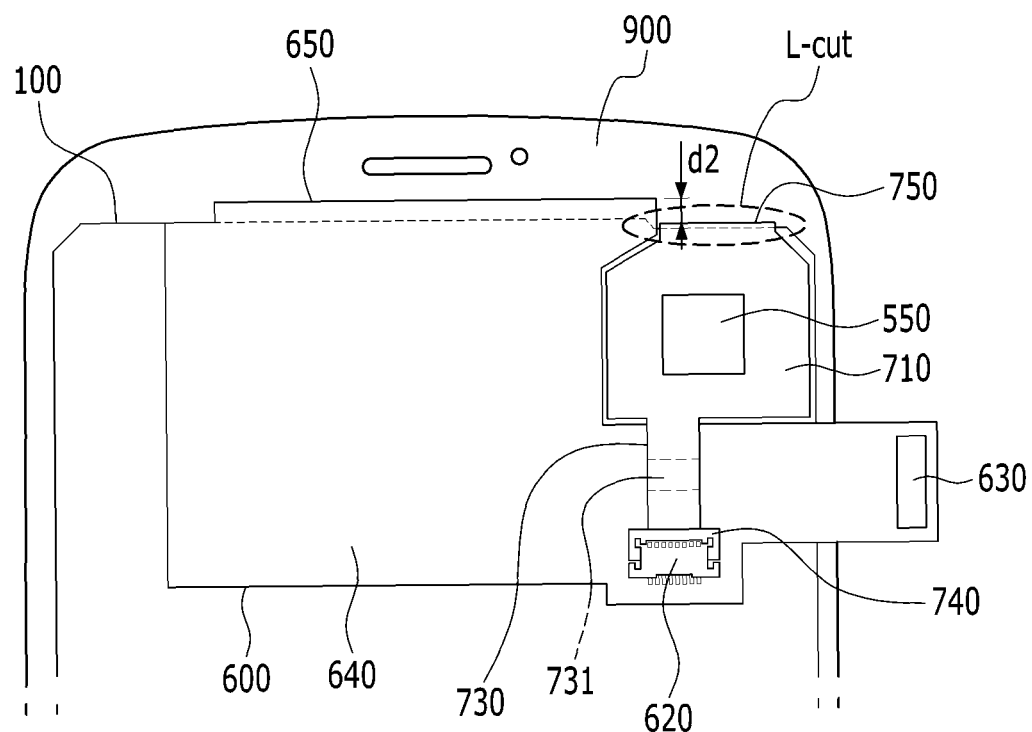
FIG. 5 is a partial plan view of the structure of the display device according to an exemplary embodiment in which the flexible printed circuit board is bent and attached to the rear surface of the lower substrate.

FIG. 5 is a partial plan view of the structure of the display device according to an exemplary embodiment in which the flexible printed circuit board is bent and attached to the lower substrate side.

In FIG. 5, the edge of the lower substrate 100 covered by the bending parts 650 and 750 of the first and second flexible printed circuit boards 600 and 700 is shown by a dotted line. In contrast to the exemplary embodiment illustrated in FIGS. 3 and 4, a portion of the edge of the lower substrate 100 surrounded by the bending part 750 of the second flexible printed circuit board 700 is recessed compared to the portion of the edge surrounded by the bending part 650 of the first flexible printed circuit board 600. The recess is referred to as an L-cut in view of its shape. The edge of the lower substrate 100 surrounded by the bending part 750 of the second flexible printed circuit board is cut deeper than the remained of the edge, and therefore the second flexible printed circuit board 700 is closer to the edge of the lower substrate 100 than in the previously described embodiment. Therefore, in comparison to the embodiment illustrated in FIG. 3 where the edge of the lower substrate 100 is cut straight, it is possible to further reduce the dead space due to the protrusion of the bending part 650.

Similar to the embodiment of FIGS. 3 and 4, the tail part 730 includes, for example, the portion 731 bent in the U-letter shape and the bent part 731 enables the reduction in the protrusion of the bending part 750. However, the bending part 750 of the FIG. 5 embodiment protrudes less than the previous embodiment (i.e. d2>d1), and therefore the bent part 731 has a larger bend.

Hereinafter, the touch sensing layer according to an exemplary embodiment will be described in detail with reference to FIGS. 6 to 8.

Figure 6:
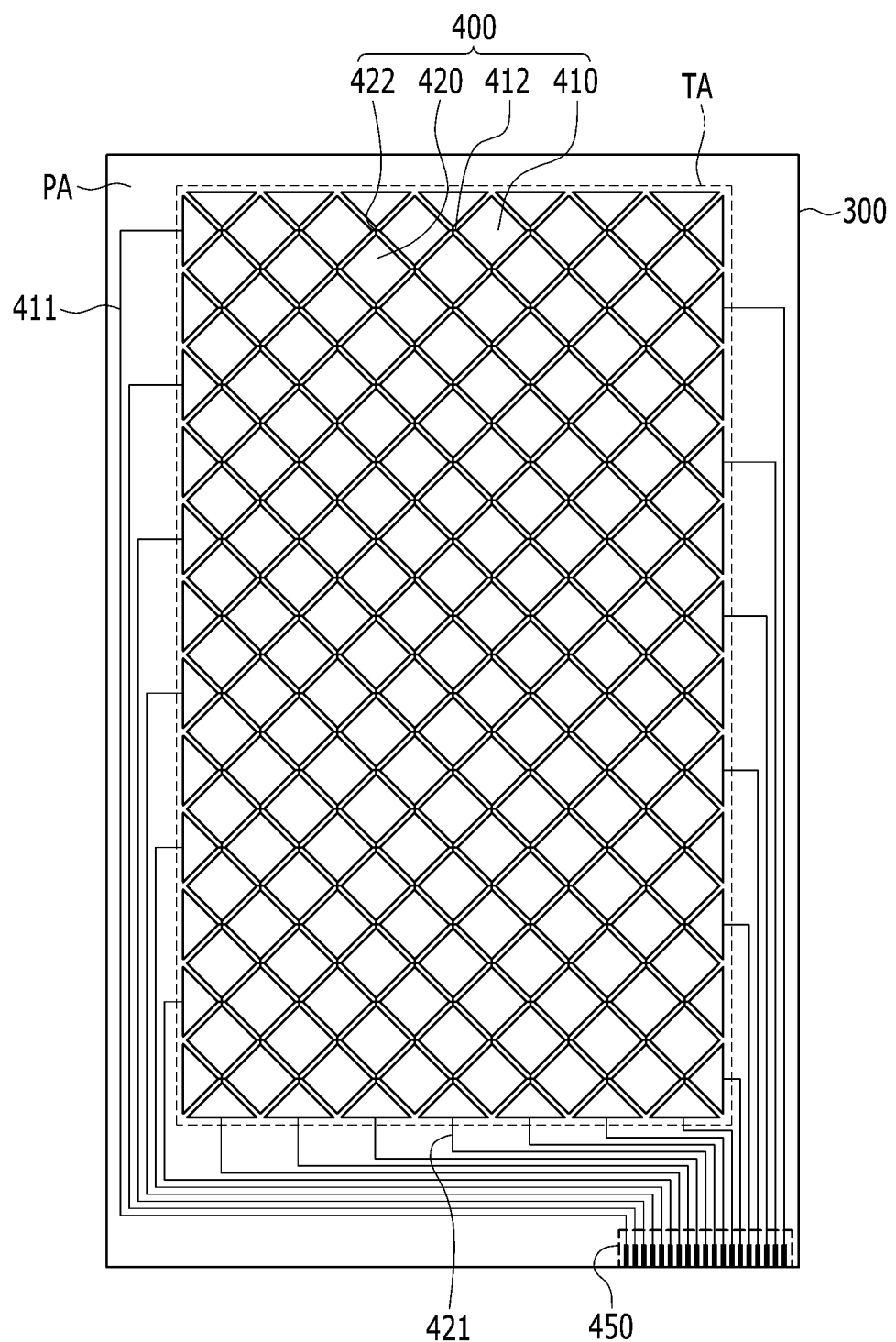
FIG. 6 is a plan view of a touch sensing layer of the display device according to an exemplary embodiment.

Referring to FIG. 6, the touch sensing layer 400 is formed on the upper substrate 300. The touch sensing layer 400 is formed in a touch active area TA configured to sense touch input. The touch active area TA may be the entire display area DA and include a portion of the peripheral area PA. In other embodiments, only a portion of the display area DA is included in the touch active area TA.

According to the embodiment, the touch sensing layer 400 senses touch input by various methods. For example, touch sensors are classified into various types, such as resistive, capacitive, electro-magnetic (EM), and optical based on the sensed properties. According to the embodiment of FIG. 6, a capacitive type touch sensor will be described by way of example.

The touch sensing layer 400 includes a plurality of touch electrodes including a plurality of first touch electrodes 410 and a plurality of second touch electrodes 420. The first and second touch electrodes 410 and 420 are separated from each other.

The first and second touch electrodes 410 and 420 are alternately arranged and formed so as not to overlap each other in the touch active area TA. The first touch electrodes 410 are formed in a column direction and a row direction and the second touch electrodes 420 are also formed in a column direction and a row direction.

According to the embodiment, the first and second touch electrodes 410 and 420 are formed on the same layer or are formed on different layers. In the FIG. 6 embodiment, first and second touch electrodes 410 and 420 each have a quadrangular shape but are not limited thereto and may have various shapes such as having a protrusion to improve the sensitivity of the touch sensing layer 400.

The first touch electrodes 410 arranged in the same row or column are connected to each other and are separated from each other inside or outside the touch active area TA. Similarly, at least a portion of the second touch electrodes 420 arranged in the same row or column are connected to each other and are separated from each other inside or outside the touch active area TA. For example, as illustrated in FIG. 6, the first touch electrodes 410 arranged in the same row are electrically connected to each other inside the touch active area TA, the second touch electrodes 420 arranged in the same column are be electrically connected to each other inside the touch active area TA. In more detail, the first touch electrodes 410 in each row are electrically connected to each other through a plurality of first connection parts 412 and the second touch electrodes 420 in each column are electrically connected to each other through a plurality of second connection parts 422.

Figure 7:
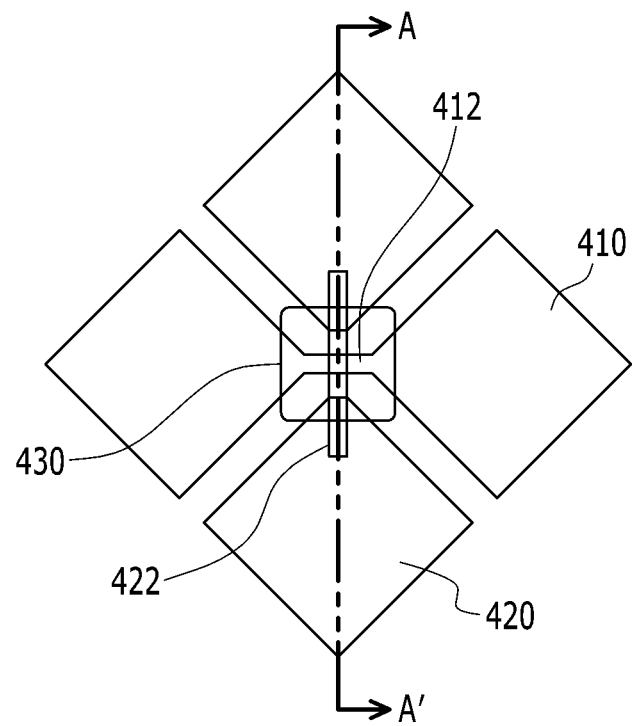
FIG. 7 is a partially enlarged view of the touch sensing layer illustrated in FIG. 6.
Figure 8:
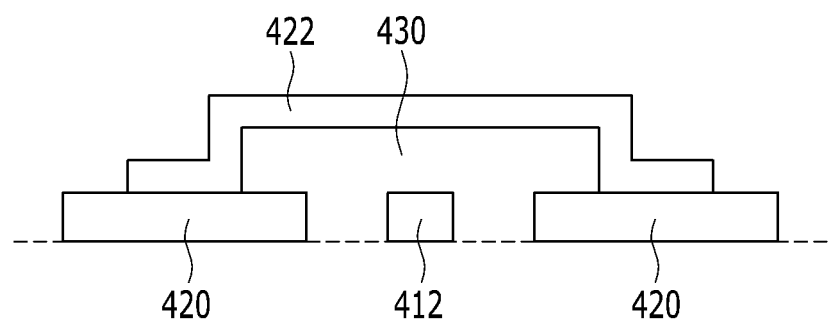
FIG. 8 is a cross-sectional view taken along line A-A' of FIG. 7.

Referring to FIGS. 7 and 8, the first connection parts 412 connecting the neighboring first touch electrodes 410 are formed on the same layer as the first touch electrodes 410 and are formed of the same material as the first touch electrodes 410. That is, the first touch electrodes 410 and the first connection parts 412 are integrally formed and simultaneously patterned.

The second connection parts 422 connecting the neighboring second touch electrodes 420 are formed on a layer different from the second touch electrodes 420. That is, the second touch electrodes 420 and the second connection parts 422 are separated from each other and are separately patterned. The second touch electrodes 420 and the second connection parts 422 are connected to each other by direct contact.

An insulating layer 430 is interposed between the first connection parts 412 and the second connection parts 422 to electrically insulate the first connection parts 412 from the second connection parts 422. As illustrated in FIGS. 7 and 8, the insulating layer 430 is formed as a plurality of independent island-type insulators which are formed at each intersection between the first and second connection parts 412 and 422. The insulating layer 430 exposes at least a portion of the second touch electrodes 420 so that the second connection parts 422 are electrically connected to the second touch electrodes 420. The insulating layer 430 may have a rounded edge or a polygonal edge. The insulating layer 430 may be formed of SiOx, SiNx and/or SiOxNy.

In other embodiments, the insulating layer 430 is formed over the entire touch active area TA and openings are formed in the insulating layer 430 over the second touch electrodes 420 for connection between the adjacent second touch electrodes 420 in each column direction.

In contrast to the embodiment illustrated in FIGS. 7 and 8, the second connection parts 422 connecting the neighboring second touch electrodes 420 can be formed on the same layer as the first touch electrodes 410 and can be integrally formed with the second touch electrodes 420. In these embodiments, the first connection parts 412 connecting the neighboring first touch electrodes 410 are formed on a layer different from the first touch electrodes 410.

Referring back to FIG. 6, the first touch electrodes 410 connected to each other in each row are connected to the touch driving unit 550 through first touch signal lines 411 and the second touch electrodes 420 connected to each other in each column are connected to the touch driving unit 550 through second touch signal lines 421. As illustrated in FIG. 6, the first and second touch signal lines 411 and 421 are formed in the peripheral area PA of the upper substrate 300. In other embodiments, the first and second touch signal lines 411 and 421 are formed in the touch active area TA. Ends of the first and second touch signal lines 411 and 421 form a pad part 450 in the peripheral area PA of the upper substrate 300.

The first and second touch electrodes 410 and 420 have a predetermined transmittance or greater such that light from the display layer 200 can be transmitted therethrough. For example, the first and second touch electrodes 410 and 420 may be formed of a thin metal layer such as indium tin oxide (ITO), indium zinc oxide (IZO), or silver nano wire (AgNw) or a transparent conductive material such as a metal mesh or a carbon nano tube (CNT), but are not limited thereto. The first and second connection parts 412 and 422 may also be formed of the above-mentioned materials.

The first and second touch signal lines 411 and 421 may include a transparent conductive material such as that included in the first and second touch electrodes 410 and 420 or a low resistive material, such as molybdenum (Mo), silver (Ag), titanium (Ti), copper (Cu), aluminum (Al), or molybdenum/aluminum/molybdenum (Mo/Al/Mo).

The first and second touch electrodes 410 and 420 which are adjacent to each other form a mutual sensing capacitor serving as the touch sensor. The mutual sensing capacitor receives a sensing input signal through one of the first and second touch electrodes 410 or 420 and outputs a change in stored charge due to the contact of external object as a sensing output signal through the other touch electrode 410 or 420.

In contrast to the embodiment illustrated in FIGS. 6 to 8, each of the first touch electrodes 410 can be separated from each other and each of the second touch electrodes 420 can also be separated from each other, such that each of the first and second touch electrodes 410 and 420 are individually electrically connected to the touch driving unit 550 through independent touch signal lines (not illustrated). In these embodiments, each touch electrode forms a self-sensing capacitor as the touch sensor. The self-sensing capacitor receives the sensing input signal and thus is charged to a predetermined charge and outputs the sensing output signal different from the input sensing input signal due to a change in the stored charged when the external object such as a finger contacts the touch active area TA.

A pixel of an OLED display according to an exemplary embodiment will be described in detail with reference to FIGS. 9 to 11.

As described above, the thin film display layer 200 includes a plurality of switching and driving thin film transistors Qs and Qd, a plurality of storage capacitors Cst, and a plurality of OLED LD. That is, the thin film display layer 200 includes a plurality of pixels.

Figure 9:
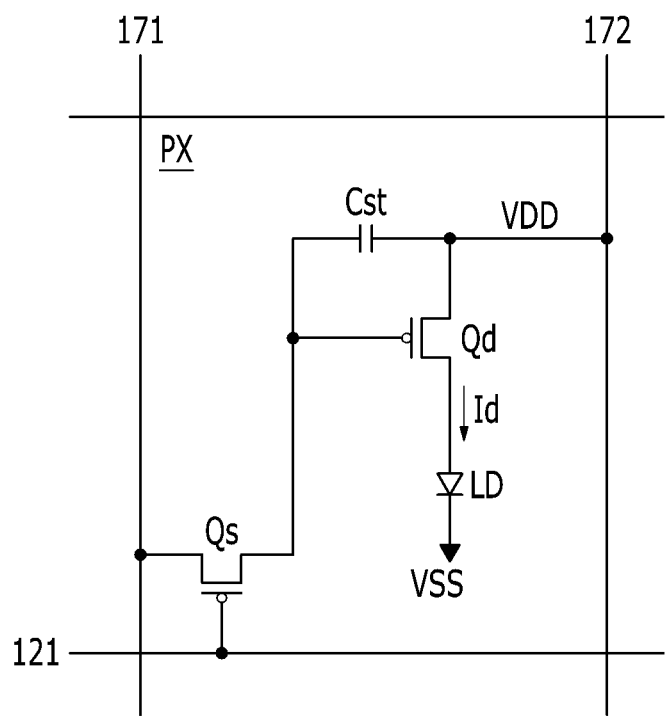
FIG. 9 is an equivalent circuit diagram of one pixel of the display device according to an exemplary embodiment.

Referring to FIG. 9, the display device includes a plurality of signal lines 121, 171, and 172 and a plurality of pixels PXs which are connected thereto and arranged in a matrix form.

The signal line includes the gate lines 121 which apply gate signals (or scanning signals), the data lines 171 which apply data signals, and the driving voltage lines 172 which apply a driving voltage VDD. The gate lines 121 extend in a row direction and are substantially parallel to each other and the data lines 171 and the driving voltage lines 172 extend in a column direction and are substantially parallel to each other. The gate signals and the data signals are applied through the display driving unit 500.

Each pixel PX includes a switching thin film transistor Qs, a driving thin film transistor Qd, a storage capacitor Cst, and an OLED LD.

The switching thin film transistor Qs includes a control terminal, an input terminal, and an output terminal. The control terminal is connected to the gate line 121, the input terminal is connected to the data line 171, and the output terminal is connected to the driving thin film transistor Qd. The switching thin film transistor Qs applies the data signal received from the data line 171 to the driving thin film transistor Qd in response to the gate signal received from the gate line 121.

The driving thin film transistor Qd also has a control terminal, an input terminal, and an output terminal. The control terminal is connected to the switching thin film transistor Qs, the input terminal is connected to the driving voltage line 172, and the output terminal is connected to the OLED LD. The driving thin film transistor Qd applies an output current Id having a magnitude which varies depending on the voltage applied between the control terminal and the output terminal.

The storage capacitor Cst is connected between the control terminal and the input terminal of the driving thin film transistor Qd. The storage capacitor Cst stores the data signal applied to the control terminal of the driving thin film transistor Qd and maintains the stored data signal even after the switching thin film transistor Qs is turned off.

The OLED LD includes an anode which is connected to the output terminal of the driving thin film transistor Qd and a cathode which is connected to a common voltage VSS. The OLED LD displays an image by emitting light with an intensity which varies depending on the output current Id of the driving thin film transistor Qd.

The switching thin film transistor Qs and the driving thin film transistor Qd may be an n-channel field effect transistor (FET) or a p-channel field effect transistor. The connection relationship between the switching and driving thin film transistors Qs and Qd, and the storage capacitor Cst, and the OLED LD may be changed according to the design requirements.

Figure 10:
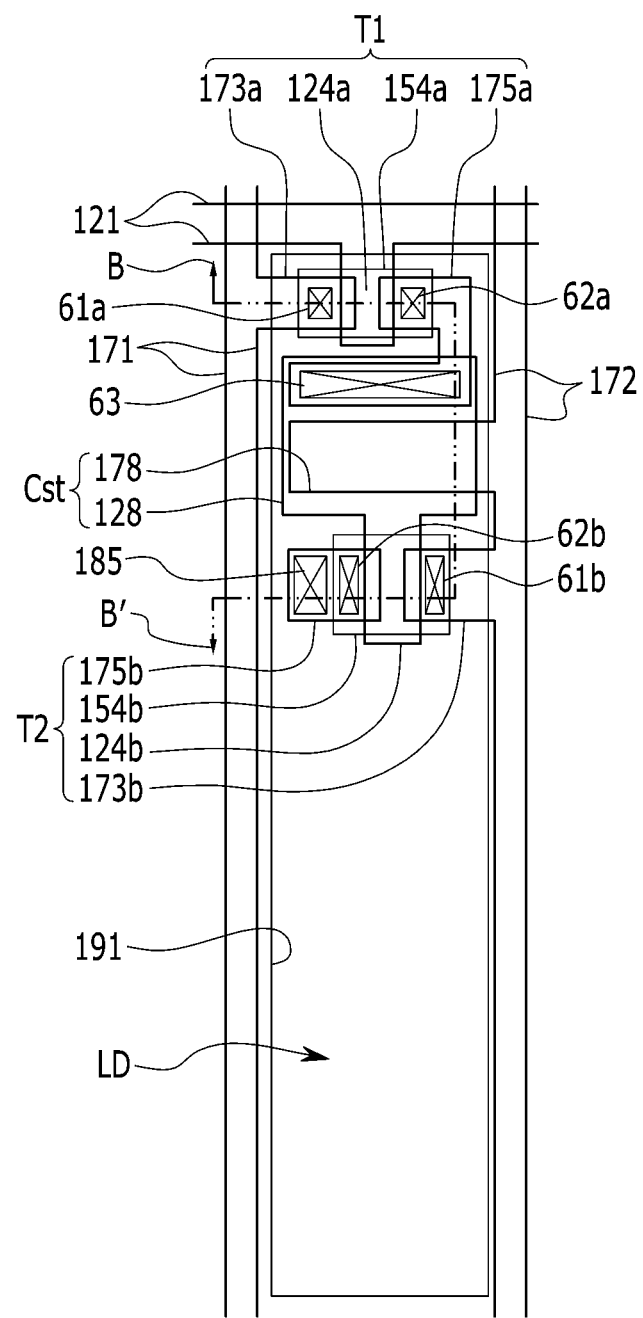
FIG. 10 is a layout view of one pixel of the display device according to an exemplary embodiment.
Figure 11:
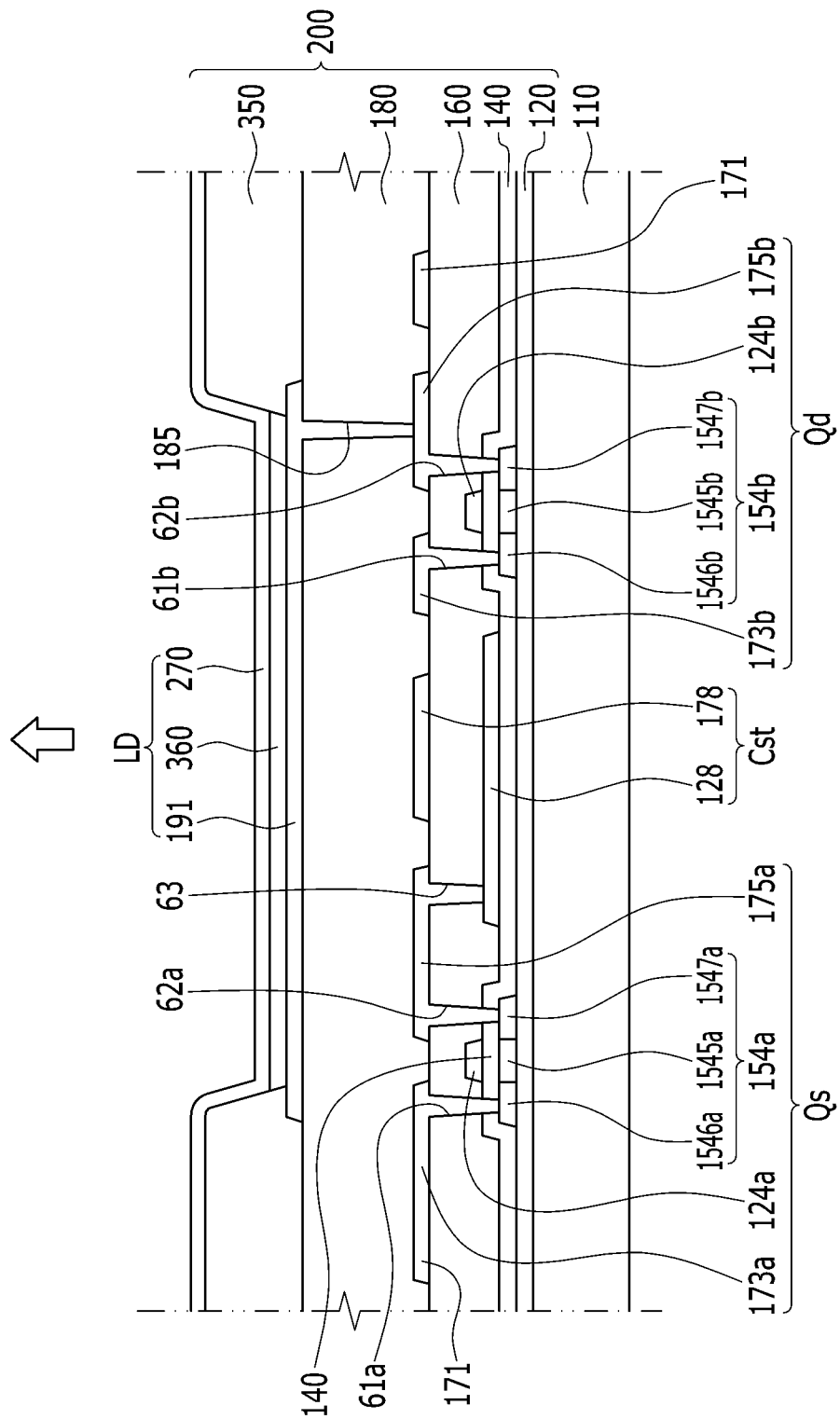
FIG. 11 is a cross-sectional view taken along line B-B' of FIG. 10.

Referring to FIGS. 10 and 11, the display device includes the lower substrate 100, the display layer 200 formed on the lower substrate 100, and the OLED LD.

The lower substrate 100 may be made of transparent glass or plastic. The lower substrate 100 may be a flexible substrate.

The display layer 200 includes a buffer layer 120, switching and driving semiconductor layers 154a and 154b, a gate insulating layer 140, the gate line 121, a first capacitor plate 128, an interlayer insulating layer 160, the data line 171, the driving voltage line 172, a switching drain electrode 175a, a driving drain electrode 175b, and a passivation layer 180.

The buffer layer 120 is formed on the lower substrate 100 and may be formed of silicon nitride (SiNx), silicon oxide (SiOx), silicon oxynitride (SiOxNy), or the like and may be formed in a single layer or a multilayer. The buffer layer 120 prevents impurities, moisture, or external air, which can degrade the characteristics of the semiconductor layers, from penetrating from the environment and serves to planarize the surface of the substrate.

The switching semiconductor layer 154a and the driving semiconductor layer 154b are formed on the buffer layer 120 and are spaced apart from each other. The switching semiconductor layer 154a and the driving semiconductor layer 154b are formed of polycrystalline silicon and include channel regions 1545a and 1545b, source regions 1546a and 1546b, and drain regions 1547a and 1547b. The source regions 1546a and 1546b and the drain regions 1547a and 1547b are each formed on opposing sides of the channel regions 1545a and 1545b.

The channel regions 1545a and 1545b are polycrystalline silicon which is not doped with impurities, that is, an intrinsic semiconductor. The source regions 1546a and 1546b are polycrystalline silicon which is doped with a conductive impurity, that is, a doped semiconductor.

The gate insulating layer 140 is formed on the channel regions 1545a and 1545b of the switching semiconductor layer 154a and the driving semiconductor layer 154b.

The gate insulating layer 140 may be formed in a single layer or a multilayer which includes one or more of silicon nitride and silicon oxide.

The gate line 121 is formed on the gate insulating layer 140. The first capacitor plate 128 is formed on the gate line 121.

The gate line 121 extends in a horizontal direction to apply the gate signal and includes a switching gate electrode 124a which protrudes from the gate line 121 to the switching semiconductor layer 154a. The first capacitor plate 128 includes a driving gate electrode 124b which protrudes from the first capacitor plate 128 to the driving semiconductor layer 154b. The switching gate electrode 124a and the driving gate electrode 124b each overlap the channel regions 1545a and 1545b.

The interlayer insulating layer 160 is formed on the gate line 121, the first capacitor plate 128, and the buffer layer 120. The interlayer insulating layer 160 has a switching source contact hole 61a and a switching drain contact hole 62a which respectively expose the source region 1546a and the drain region 1547a of the switching semiconductor layer 154a. Further, the interlayer insulating layer 160 has a driving source contact hole 61b and a driving drain contact hole 62b which respectively expose the source region 1546b and the drain region 1547b of the driving semiconductor layer 154b.

The data line 171, the driving voltage line 172, the switching drain electrode 175a, and the driving drain electrode 175b are formed on the interlayer insulating layer 160.

The data line 171 applies the data signal, extends in a direction crossing the gate line 121, and includes a switching source electrode 173a which protrudes toward the switching semiconductor layer 154a from the data line 171.

The driving voltage line 172 applies the driving voltage, is separated from the data line 171, and extends in the same direction as the data line 171. The driving voltage line 172 includes a driving source electrode 173b which protrudes toward the driving semiconductor layer 154b from the driving voltage line 172 and a second capacitor plate 178 which protrudes from the driving voltage line 172 to overlap the first capacitor plate 128.

The first capacitor plate 128 and the second capacitor plate 178 form the storage capacitor Cst using the interlayer insulating layer 160 as a dielectric material.

The switching drain electrode 175a faces the switching source electrode 173a and the driving drain electrode 175b faces the driving source electrode 173b.

The switching source electrode 173a and the switching drain electrode 175a are respectively connected to the source region 1546a and the drain region 1547a of the switching semiconductor layer 154a through the switching source contact hole 61a and the switching drain contact hole 62a. Further, the switching drain electrode 175a is electrically connected to the first capacitor plate 128 and the driving gate electrode 124b through a first contact hole 63 which is formed in the interlayer insulating layer 160.

The driving source electrode 173b and the driving drain electrode 175b are respectively connected to the source region 1546b and the drain region 1547b of the driving semiconductor layer 154b through the driving source contact hole 61b and the driving drain contact hole 62b.

The switching semiconductor layer 154a, the switching gate electrode 124a, the switching source electrode 173a, and the switching drain electrode 175a form the switching thin film transistor Qs. The driving semiconductor layer 154b, the driving gate electrode 124b, the driving source electrode 173b, and the driving drain electrode 175b form the driving thin film transistor Qd.

The passivation layer 180 is formed on the data line 171, the driving voltage line 172, the switching drain electrode 175a, and the driving drain electrode 175b. The passivation layer 180 has a second contact hole 185 which exposes the driving drain electrode 175b.

The OLED LD and a pixel defining layer 350 are formed on the passivation layer 180.

The OLED LD includes a pixel electrode 191, an organic emission layer 360, and a common electrode 270.

The pixel electrode 191 is formed on the passivation layer 180 and is electrically connected to the driving drain electrode 175b of the driving thin film transistor Qd through the second contact hole 185 formed in the interlayer insulating layer 160. The pixel electrode 191 is the anode of the OLED LD.

The pixel electrode 191 may be formed of a transparent conductive material such as ITO, IZO, ZnO, and $In_2O_3$ or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The pixel defining layer 350 is formed on an edge portion of the pixel electrode 191 and the passivation layer 180. The pixel defining layer 350 has an opening 195 through which the pixel electrode 191 is exposed. The pixel defining layer 350 may be formed of a resin such as polyacrylates or polyimides.

The organic emission layer 360 is formed on the pixel electrode 191 within the opening of the pixel defining layer 350. The organic emission layer 360 includes an emission layer and is formed in a multilayer including one or more of a hole injection layer (HIL), a hole transport layer (HTL), an electron transport layer (ETL), and an electron injection layer (EIL). When the organic emission layer 360 includes all of the layers, the hole injection layer is formed on the pixel electrode 191 which is an anode, and the hole transport layer, the emission layer, the electron transport layer, and the electron injection layer are sequentially stacked thereon.

The organic emission layer 360 include one of a red, green, or blue organic emission layer which emits red, green, or blue light. The red, green, and blue organic emission layers are respectively formed in red, green, and blue pixels to implement color images. The organic emission layer 360 may also implement color images by stacking the red, green, and blue organic emission layers in each of the red, green, and blue pixels and forming one of red, green, and blue color filters for each pixel.

The common electrode 270 is formed on the pixel defining layer 350 and the organic emission layer 360. The common electrode 270 may be made of a transparent conductive material such as ITO, IZO, ZnO, or $In_2O_3$ or a metal such as lithium, calcium, lithium fluoride/calcium, lithium fluoride/aluminum, aluminum, silver, magnesium, or gold. The common electrode 270 is the cathode of the OLED LD.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a lower substrate;
a display layer formed over the lower substrate and comprising a plurality of pixels, wherein each pixel includes an electro-optical active layer;
an upper substrate formed over the display layer;
a touch sensing layer formed over the upper substrate;
a first flexible printed circuit board electrically connected to the display layer and attached to a surface of the lower substrate, wherein the first flexible printed circuit board includes a first body; and
a second flexible printed circuit board electrically connected to the touch sensing layer and attached to the surface of the lower substrate,
wherein the second flexible printed circuit board includes i) a second body having a first end connected to the touch sensing layer and ii) a tail extending from a second end of the second body, wherein the first and second ends oppose each other,
wherein the tail includes a connection portion electrically connected to the first flexible printed circuit board, and
wherein at least a portion of the tail is bent.

2. The display device of claim 1, wherein the bent portion of the tail has a substantially U-shape.

3. The display device of claim 2, wherein the bent portion of the tail is more flexible than the remaining portion of the tail.

4. The display device of claim 3, wherein the bent portion of the tail has a thickness that is less than that of the remaining portion of the tail.

5. The display device of claim 1, wherein the connection portion of the tail is connected to the first flexible printed circuit board through a zero insertion force (ZIF) connector.

6. The display device of claim 1, wherein the connection portion of the tail part is connected to the first flexible printed circuit board through an anisotropic conductive film (ACF).

7. The display device of claim 1, further comprising a cushion layer interposed between the surface of lower substrate and the first and second flexible printed circuit boards, wherein the first and second flexible printed circuit boards are attached to the cushion layer.

8. The display device of claim 1, wherein the first and second bodies are bent around an edge of the lower substrate, and wherein the bent portion of the first body protrudes farther from the edge than that of the second body.

9. The display device of claim 8, wherein the bent portions of first and second bodies do not overlap each other.

10. The display device of claim 9, wherein the second body does not overlap the first flexible printed circuit board and wherein at least a portion of the tail overlaps the first flexible printed circuit board.

11. The display device of claim 10, wherein a recess is formed in a portion of the edge of the lower substrate adjacent to the bent portion of the second body.

12. The display device of claim 1, further comprising:
a display driver formed over the lower substrate and configured to drive the display layer; and
a touch driver formed under the second flexible printed circuit board and configured to drive the touch sensing layer.

13. The display device of claim 1, wherein the electro-optical active layer is an organic emission layer and wherein the upper substrate is an encapsulation substrate.

14. A display device, comprising:
a substrate;
a plurality of pixels formed over the substrate;
an encapsulation layer formed over the pixels;
a touch sensing layer formed over the encapsulation layer;
a first flexible printed circuit board including i) a first connection portion formed over the substrate and electrically connected to the pixels and ii) a first body attached to a surface of the substrate; and
a second flexible printed circuit board including i) a second connection portion formed over and electrically connected to the touch sensing layer and ii) a second body attached to the surface of the substrate,
wherein the first flexible circuit board protrudes farther from an edge of the substrate than the second flexible circuit board.

15. The display device of claim 14, wherein the first and second bodies are bent around the edge of the substrate.

16. The display device of claim 15, wherein the second flexible circuit board further includes a tail extending from the second body and electrically connected to the first flexible circuit board.

17. The display device of claim 16, wherein at least a portion of the tail is bent and wherein the bent portion of the tail is more flexible than the remaining portion of the tail.

18. The display device of claim 15, wherein a recess is formed in a portion of the edge of the substrate adjacent to the bent portion of the second body.

19. The display device of claim 14, wherein the first and second bodies do not overlap each other.

* * * * *